United States Patent
Hsia et al.

Patent Number: 6,048,762
Date of Patent: Apr. 11, 2000

[54] METHOD OF FABRICATING EMBEDDED DYNAMIC RANDOM ACCESS MEMORY

[75] Inventors: Liang-Choo Hsia; H. J. Wu, both of Hsinchu, Taiwan

[73] Assignee: United Integrated Circuits Corp., Hsinchu, Taiwan

[21] Appl. No.: 09/055,577

[22] Filed: Apr. 6, 1998

[30] Foreign Application Priority Data

Feb. 13, 1998 [TW] Taiwan ................................. 87102008

[51] Int. Cl.⁷ ............................................. H01L 21/8244
[52] U.S. Cl. ......................... 438/238; 438/387; 438/622; 438/672
[58] Field of Search .................................... 438/238, 256, 438/272, 399, 734, 743, FOR 125, 672, 675; 257/306, 756

[56] References Cited

U.S. PATENT DOCUMENTS

| | | | |
|---|---|---|---|
| 5,627,095 | 5/1997 | Koh et al. ................................ | 438/672 |
| 5,644,151 | 7/1997 | Izumi et al. ............................ | 257/306 |
| 5,689,126 | 11/1997 | Takaishi ................................. | 257/306 |
| 5,702,982 | 12/1997 | Lee et al. ................................ | 438/256 |
| 5,741,741 | 4/1998 | Tseng ...................................... | 438/672 |
| 5,747,369 | 5/1998 | Kantimahanti et al. ................ | 438/241 |
| 5,932,928 | 8/1999 | Clampitt ................................. | 257/758 |

FOREIGN PATENT DOCUMENTS

| | | | |
|---|---|---|---|
| 01222469 | 9/1989 | Japan ........................................... | 27/4 |
| 01243569 | 9/1989 | Japan ........................................... | 27/4 |
| 03205866 | 9/1991 | Japan ......................................... | 27/108 |
| 09162370 | 6/1997 | Japan ......................................... | 27/108 |

OTHER PUBLICATIONS

IBM Technical Disclosure Bulletin, vol. 34, No. 7A, Dec. 1991.

*Primary Examiner*—Wael Fahmy
*Assistant Examiner*—William David Coleman
*Attorney, Agent, or Firm*—Thomas, Kayden, Horstemeyer & Risley

[57] ABSTRACT

A method of fabricating an embedded dynamic random access memory. Using the method of dual damascence, by forming patterning only one dielectric layer, the contact windows with different depth are formed. In addition, the metal layer formed within the metal connecting regions are used as interconnects without further process.

8 Claims, 3 Drawing Sheets

METHOD OF FABRICATING EMBEDDED DYNAMIC RANDOM ACCESS MEMORY

CROSS-REFERENCE TO RELATED APPLICATION

This application claims priority benefit of Taiwan application Serial no. 87102008, filed Feb. 13, 1998, the full disclosure of which is incorporated herein by reference.

BACKGROUND OF THE INVENTION

1. Field of the Invention

The invention relates to a method of fabricating an integrated circuit, and more particularly to a method of fabricating an embedded dynamic random access memory (DRAM).

2. Description of the Related Art

To meet the requirement of higher and higher integration, an integrated circuit is designed with a smaller and smaller dimension. A single DRAM cell comprising a MOS transistor and a capacitor. Therefore, in an integrated circuit comprising a DRAM, a smaller dimension is obtained by reducing the size of a transistor and a capacitor, or saving the space occupied by an interconnect between devices. By decreasing the dimension of a capacitor, the surface area is reduced, and therefore, the resistance effect becomes more obvious, and the quality of capacitor is degraded. Being restricted by the technique limit, a degradation occurs while further reducing the dimension of the transistor. Thus, in an embedded DRAM, a buried-in bit line is formed to save the space occupied by interconnects. Consequently, the dimension of the integrated circuit is reduced.

In a conventional integrated circuit comprising embedded DRAMs, various levels and types of contacts, for example, contacts for bit lines, contacts for capacitors, and contacts for logic circuits, are formed in different process, respectively. In each process of forming a contact, a metal layer, such as a tungsten layer, is formed and etched back or processed by chemical-mechanical polishing (CMP). After the formation of a contact, another metal layer is formed for electrical connection. The process is very complex, and the cost of fabrication is high.

SUMMARY OF THE INVENTION

It is therefore an object of the invention to provide a method of fabricating a DRAM. Using a method of dual damascence, by forming and patterning only a dielectric layer, a contact for the bit line, a contact for a capacitor, and a contact for a logic circuit are formed.

To achieve these objects and advantages, and in accordance with the purpose of the invention, as embodied and broadly described herein, the invention is directed towards a method of fabricating an embedded DRAM. A substrate having a metal-oxide-semiconductor which comprises a gate and a source/drain region, and a planarized first dielectric layer formed thereon is provided. The first dielectric layer is patterned to form a plurality of metal connecting regions without penetrating the first dielectric layer and exposing the substrate. The first dielectric layer is patterned to form a first contact window for connecting a capacitor and a second contact window for connecting a bit line, so that the source/drain region is exposed within the first and the second contact windows. The first dielectric layer is further patterned to form a third contact window for connecting a logic circuit, so that the gate is exposed within the third contact window. A barrier layer over the substrate, and a second dielectric layer is formed on the barrier layer. The second dielectric layer is patterned, so that only the second contact window for connecting the capacitor is covered by the second dielectric layer. A metal layer over the substrate and planarized dielectric as an etch stop. Whereas, the first contact window and the second contact window have a same depth and are formed at a same level, whereas the third contact window has a depth different from the first and the second contact window.

It is to be understood that both the foregoing general description and the following detailed description are exemplary and explanatory only and are not restrictive of the invention, as claimed.

DESCRIPTION OF THE PREFERRED EMBODIMENTS

Figure 1A:
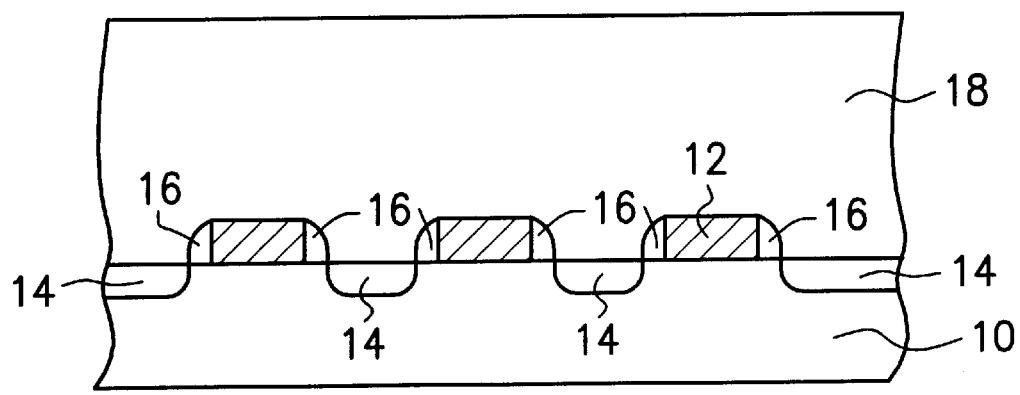
FIG. 1A to FIG. 1G are cross sectional views of a process of fabricating an embedded DRAM in a preferred embodiment according to the invention.

Referring to FIG. 1A, a substrate 10 having a gate 12, a source/drain region 14, and a shallow trench isolation (not shown) formed thereon is provided. A spacer 16 is formed on the side wall of the gate 12. A dielectric layer 16 is formed over the substrate 10, for example, a silicon oxide layer formed by chemical vapour deposition. The dielectric layer 18 is planarized, for example, by CMP.

Figure 1B:
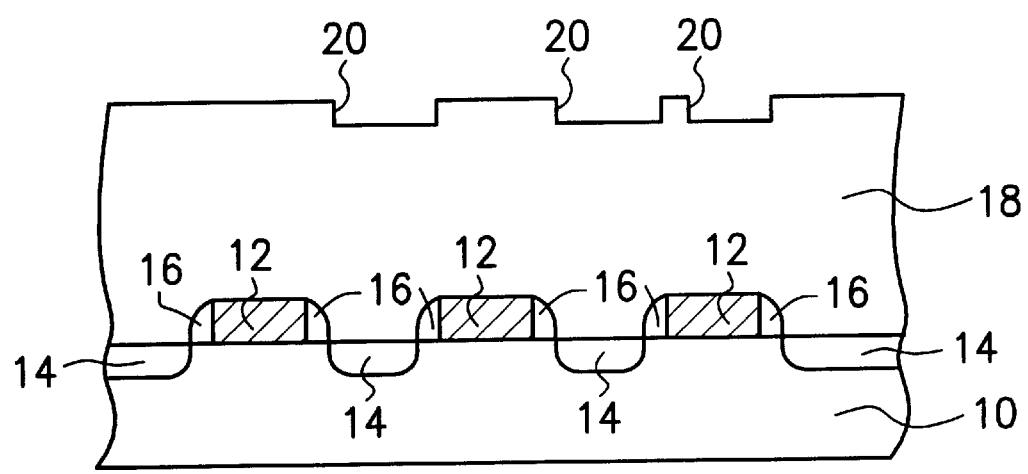

Referring to FIG. 1B, the dielectric layer 18 is patterned to form several shallow metal connecting regions 20. Whereas, the dielectric layer 18 is not penetrated through by the shallow metal connecting regions 20, and the device under the dielectric layer 18 is not exposed within the metal connecting regions 20.

Figure 1C:
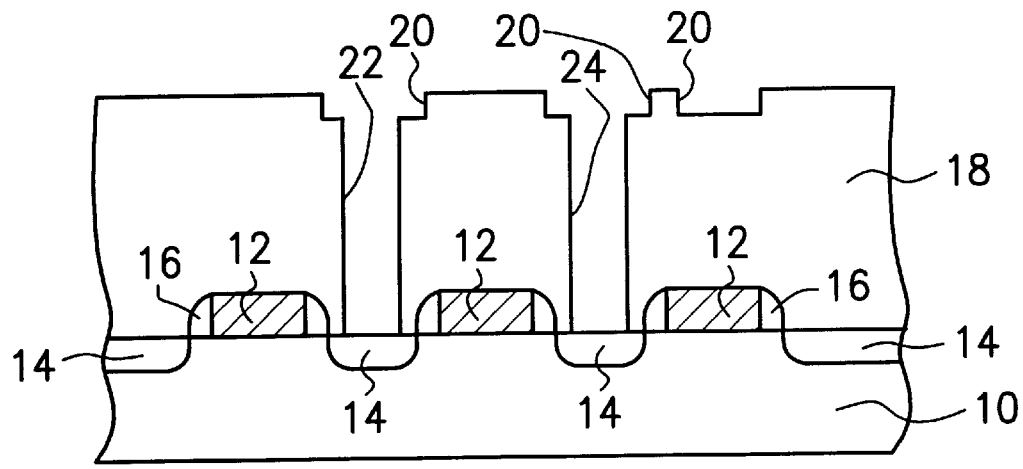

Referring to FIG. 1C, the dielectric layer 18 is patterned again to form a first contact window 22 for connecting a capacitor, a second contact window 24 for connecting a bit line, and a third contact window (not shown) for connecting a logic circuit and to expose the source/drain region 14 within some of the metal connecting regions 20. The first contact window 22, the second contact window 24, and the third contact window 26 have a same depth and are formed at a same level.

Figure 1D:
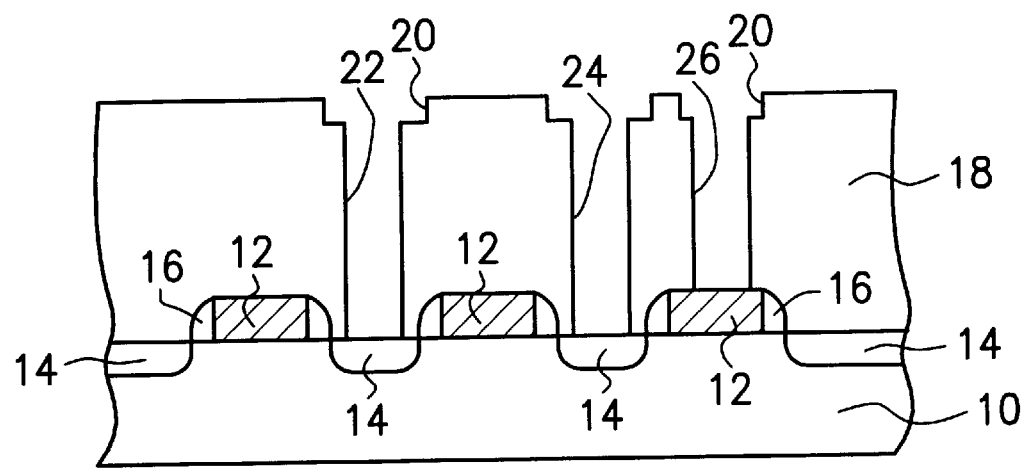

Referring to FIG. 1D, the dielectric layer 18 is further patterned to form a fourth contact window 26 and to expose the gate 12 within one of the metal connecting region 20. As shown on the figure, the fourth contact window 26 is not at the same level of the first 22, the second 24, and the third (not shown) contact window.

Figure 1E:
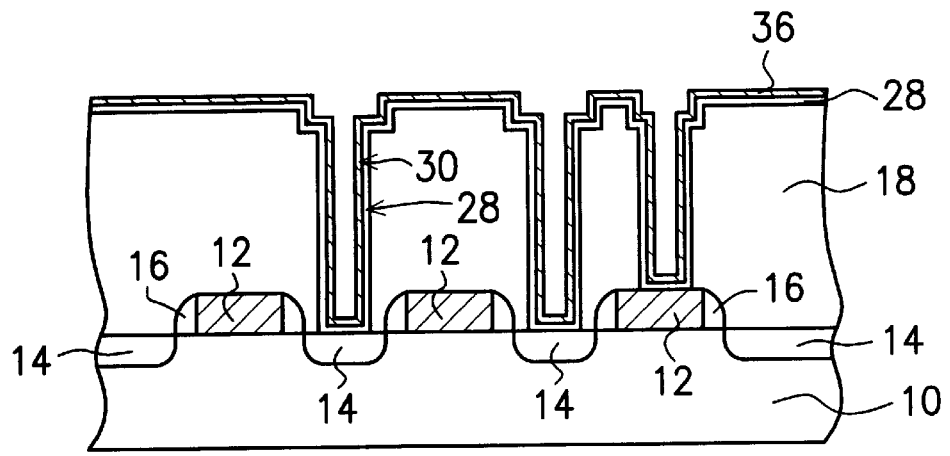
Figure 1F:
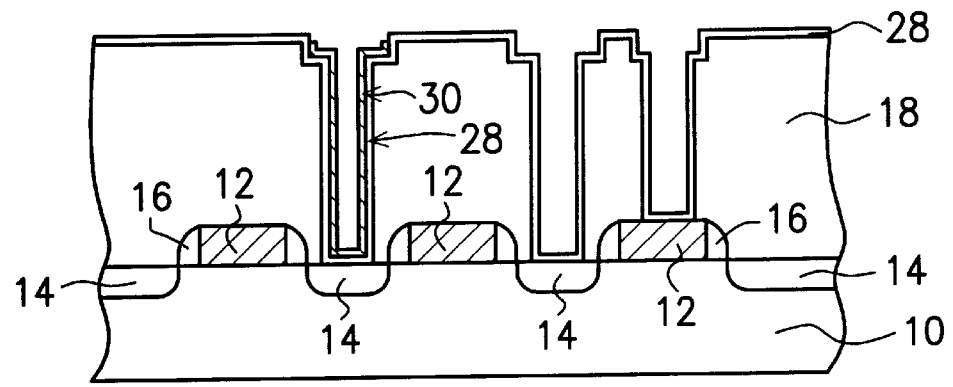

Referring to FIG. 1E, a barrier layer 28 is formed over the substrate 10, for example, a titanium nitride layer formed by chemical vapour deposition. A dielectric layer 30, for example, a tantalum oxide layer, is formed on the titanium nitride layer 28. The dielectric layer 30 is etched by forming a photo-resist layer as a mask. As a consequence, only the second contact window 24 and the metal connecting region 20 having the second contact window 24 formed therewithin is covered by the dielectric layer 30, as shown in FIG. 1F.

Figure 1G:
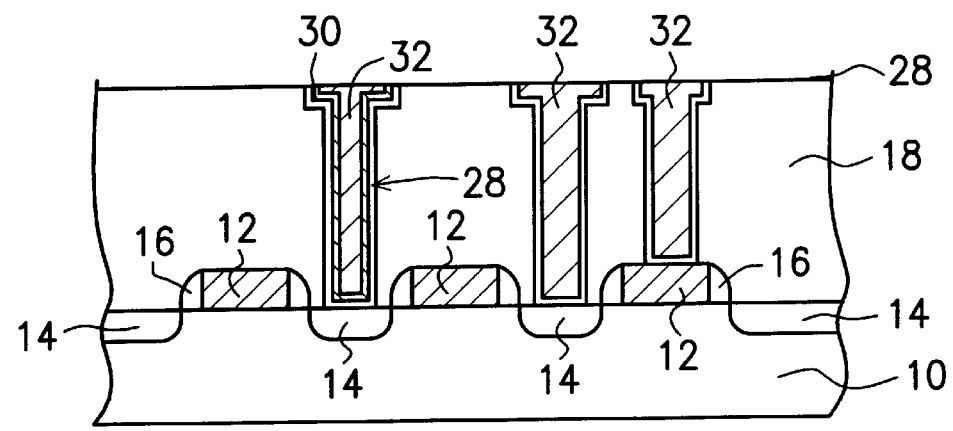

Referring to FIG. 1G, a metal layer 32, such as a tungsten layer, is formed over the substrate 10 and fills the metal connecting regions 20. The metal layer 32 and the barrier layer 28 are planarized with the dielectric layer 18 as an etch stop. A capacitor is formed within the second contact window 24, and metal plugs are formed within the first contact window 22, the third contact window (not shown), and the fourth contact window 26. The metal layer 32 within the metal connecting region 20 is used as interconnects.

The characteristics of the invention is the method of dual damascence. By forming only one dielectric layer, the contact windows with different depth are formed. In addition, the metal layer formed within the metal connecting regions are used as interconnects without further process. Therefore, the process is simplified and the cost is reduced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating an embedded dynamic random access memory, comprising:

providing a substrate having a metal-oxide-semiconductor which comprises a gate and a source/drain region, and a planarized first dielectric layer formed therein;

patterning the first dielectric layer to form a plurality of metal connecting regions without penetrating through the first dielectric layer to expose the substrate;

patterning the first dielectric layer to form a first contact window for connecting a capacitor within a first of the metal connecting regions, and a second contact window for connecting a bit line within a second of the metal connecting regions, so that the source/drain region is exposed within the first and the second contact windows;

patterning the first dielectric layer to form a third contact window for connecting a logic circuit within a third of the metal connecting regions, so that the gate is exposed within the third contact window;

forming a barrier layer over the substrate;

forming a second dielectric layer on the barrier layer;

patterning the second dielectric layer, so that only the second contact window for connecting the capacitor and the second of the metal connecting regions are covered by the second dielectric layer;

forming a metal layer over the substrate; and planarizing the metal layer and the barrier layer with the first dielectric as an etch stop;

wherein the first contact window and the second contact window have a same depth and are formed at a same level, whereas the third contact window has a depth different from the first and the second contact window.

2. The method according to claim 1, after the first dielectric layer is a silicon oxide layer.

3. The method according to claim 1, wherein the first dielectric layer is formed by chemical vapour deposition.

4. The method according to claim 1, wherein the first dielectric layer is planarized by chemical-mechanical polishing.

5. The method according to claim 1 wherein the barrier layer is a titanium nitride layer.

6. The method according to claim 1, wherein the second dielectric layer is a tantalum oxide layer.

7. The method according to claim 1, wherein the metal layer is a tungsten layer.

8. The method according to claim 1, wherein the metal layer and the barrier layer is planarized by chemical-mechanical polishing.

* * * * *